United States Patent
Han et al.

(10) Patent No.: US 10,619,469 B2
(45) Date of Patent: Apr. 14, 2020

(54) HYDRAULIC FRACTURING IN KEROGEN-RICH UNCONVENTIONAL FORMATIONS

(71) Applicant: Saudi Arabian Oil Company, Dhahran (SA)

(72) Inventors: Yanhui Han, Katy, TX (US); Leiming Li, Sugar Land, TX (US); Ghaithan Muntasheri, Katy, TX (US); Younane N. Abousleiman, Norman, OK (US); Katherine Leigh Hull, Houston, TX (US); David Jacobi, Spring, TX (US)

(73) Assignee: Saudi Arabian Oil Company, Dhahran (SA)

( * ) Notice: Subject to any disclaimer, the term of this patent is extended or adjusted under 35 U.S.C. 154(b) by 102 days.

(21) Appl. No.: 15/190,687

(22) Filed: Jun. 23, 2016

(65) Prior Publication Data

US 2017/0370197 A1 Dec. 28, 2017

(51) Int. Cl.
*E21B 43/26* (2006.01)
*E21B 43/267* (2006.01)
(Continued)

(52) U.S. Cl.
CPC ............... *E21B 43/26* (2013.01); *C09K 8/62* (2013.01); *E21B 41/0092* (2013.01); *E21B 43/24* (2013.01); *E21B 43/267* (2013.01); *G01V 99/005* (2013.01); *G06F 30/20* (2020.01); *G06Q 30/0201* (2013.01); *E21B 49/00* (2013.01)

(58) Field of Classification Search
CPC ........ E21B 43/26; E21B 43/24; E21B 43/267; G06F 17/5009
See application file for complete search history.

(56) References Cited

U.S. PATENT DOCUMENTS 7,344,889 B2 3/2008 Kelemen et al.
7,526,418 B2 4/2009 Pita et al.
(Continued)

FOREIGN PATENT DOCUMENTS

WO WO2015181028 A1 12/2015

OTHER PUBLICATIONS

Walters, Harold G., Ronnie G. Morgan, and Phillip C. Harris. "Kinetic rheology of hydraulic fracturing fluids." SPE Annual Technical Conference and Exhibition. Society of Petroleum Engineers, 2001. (Year: 2001).*

(Continued)

*Primary Examiner* — Aniss Chad
*Assistant Examiner* — Joshua E. Jensen
(74) *Attorney, Agent, or Firm* — Fish & Richardson P.C.

(57) ABSTRACT

A method for treating a geologic formation that includes providing a hydraulic fracture model, providing a first value representative of a volume of kerogen breaker in a fracturing fluid, determining a discrete fracture network (DFN) based on the hydraulic fracture model and the first value, determining a geomechanical model based on the DFN and a reservoir model based on the DFN, determining a hydrocarbon production volume based on the geomechanical model and the reservoir model, adjusting the first value based on the hydrocarbon production volume, and adjusting a volume of kerogen breaker in the fracturing fluid to a hydrocarbon reservoir based on the adjusted first value.

19 Claims, 3 Drawing Sheets

(51) Int. Cl.
*C09K 8/62* (2006.01)
*G06F 30/20* (2020.01)
*E21B 41/00* (2006.01)
*E21B 43/24* (2006.01)
*G01V 99/00* (2009.01)
*G06Q 30/02* (2012.01)
*E21B 49/00* (2006.01)

(56) References Cited

U.S. PATENT DOCUMENTS

| | | | |
|---|---|---|---|
| 8,165,817 B2 | 4/2012 | Betancourt et al. | |
| 8,352,228 B2 | 1/2013 | Walters et al. | |
| 2006/0047489 A1 | 3/2006 | Scheidt et al. | |
| 2006/0092766 A1 | 5/2006 | Shelley et al. | |
| 2006/0265204 A1 | 11/2006 | Wallis et al. | |
| 2008/0059140 A1 | 3/2008 | Salmon et al. | |
| 2009/0071239 A1 | 3/2009 | Rojas et al. | |
| 2010/0224365 A1* | 9/2010 | Abad | E21B 43/26 166/275 |
| 2011/0065612 A1* | 3/2011 | Stokes | C02F 1/682 507/244 |
| 2011/0257944 A1* | 10/2011 | Du | E21B 43/267 703/2 |
| 2012/0179444 A1* | 7/2012 | Ganguly | E21B 43/26 703/10 |
| 2013/0231908 A1 | 9/2013 | Williams et al. | |
| 2015/0019183 A1* | 1/2015 | Suzuki | E21B 43/16 703/2 |
| 2016/0265331 A1* | 9/2016 | Weng | E21B 43/267 |

OTHER PUBLICATIONS

Kim, Jihoon, and George J. Moridis. "Numerical analysis of fracture propagation during hydraulic fracturing operations in shale gas systems." International Journal of Rock Mechanics and Mining Sciences 76 (2015): 127-137. (Year: 2015).*

Shahid, Arshad Shehzad Ahmad, et al. "Natural-fracture reactivation in shale gas reservoir and resulting microseismicity." Journal of Canadian Petroleum Technology 54.06 (2015): 450-459. (Year: 2015).*

Abousleiman et al., "The Granular and Polymer Nature of Kerogen Rich Shale," Published in 2016, Acta Geotechnica, 24 pages.

PCT International Search Report and Written Opinion of the International Searching Authority, PCT/US2017/037131, Oct. 4, 2017, 10 pages.

Gulf Cooperation Council Examination Report issued in GCC Application No. GC 2017-33605 dated Oct. 21, 2019, 3 pages.

Canadian Office Action issued in Canadian Application No. 3,028,374 dated Nov. 15, 2019, 3 pages.

* cited by examiner

HYDRAULIC FRACTURING IN KEROGEN-RICH UNCONVENTIONAL FORMATIONS

TECHNICAL FIELD

This disclosure relates to the adjustment of quantities of hydraulic fracturing agents provided to kerogen-rich reservoirs for hydrocarbon extraction.

BACKGROUND

In some instances, a geologic formation, such as shale, may be fractured to initiate or enhance hydrocarbon production from the formation. Fracturing typically involves pumping a fluid into a wellbore at a particular pressure to break, or "fracture," the geologic formation. The hydrocarbon fluid may then flow through the fractures and cracks generated by the fracturing process to the wellbore, and ultimately to the surface. In some instances, the fracturing process includes multiple stages of high-pressure fluid circulation into the wellbore, which may involve increased costs and complexities.

SUMMARY

In general, this document describes the use of hydraulic fracturing agents for hydrocarbon extraction in kerogen-rich unconventional formations.

In a first aspect, a method for treating a geologic formation includes providing a hydraulic fracture model, providing a first value representative of a volume of kerogen breaker in a fracturing fluid, determining a discrete fracture network (DFN) based on the hydraulic fracture model and the first value, determining a geomechanical model based on the DFN and a reservoir model based on the DFN, determining a hydrocarbon production volume based on the geomechanical model and the reservoir model, adjusting the first value based on the hydrocarbon production volume, and adjusting a volume of kerogen breaker in the fracturing fluid to a hydrocarbon reservoir based on the adjusted first value.

Various implementations can include some, all, or none of the following features. The method can further include providing a second value representative of an amount of heat to apply to the hydrocarbon reservoir, adjusting the second value based on the hydrocarbon production volume, wherein, determining the DFN can be further based on the second value, and adjusting the amount of heat to apply to the hydrocarbon reservoir is further based on the adjusted second value. The amount of heat can have a heating cost, the hydrocarbon production volume can have a market value, and adjusting the second value can include determining a difference between the market value and the heating cost and adjusting the second value to increase the difference. The method can further include extracting a volume of hydrocarbon from the hydrocarbon reservoir based on the volume of kerogen breaker in the fracturing fluid, and adjusting the second value based on the extracted volume. The volume of kerogen breaker in the fracturing fluid can have a material cost, the hydrocarbon production volume can have a market value, and adjusting the first value can include determining a difference between the market value and the material cost and adjusting the first value to increase the difference. The DFN can be descriptive of one or more of new fractures that are predicted to be created based on the hydraulic fracturing model, modified shale properties predicted to be modified based on the hydraulic fracturing model, and reactivated fractures that are predicted to be reactivated based on the hydraulic fracturing model and the modified shale properties. The hydraulic fracture model can be configured to determine the DFN further based on one or more of in-situ stresses in the reservoir field, pore pressures in the reservoir field, injection plans of a fracturing job, heterogeneity in the reservoir formation, elastic stiffness properties of reservoir rocks, plastic strength properties of reservoir rocks, and mechanical properties of heterogeneities, and the DFN can include a number of fractures each characterized by one or more of fracture length, fracture width, fracture height, and fracture orientation. The geomechanical model can be configured to predict the evolution of at least one of stress fields, deformation, and damage in the reservoir based on one or more of in-situ stresses in the reservoir field, pore pressures in the reservoir field, rock masses of reservoir layers, the DFN, constitutive models of rock mass that describe stress-deformation-failure processes of reservoirs under loading modes, mechanical properties of rock masses, mechanical properties of fractures, fluid mechanical interaction parameters, and thermal mechanical coupling parameters. The reservoir model can be configured to predict the evolution of multiphase flow and pressure fields in the reservoir based on one or more of reservoir pressure distribution parameters, reservoir temperature distribution parameters, multiphase flow models for fluid flow in rock, multiphase flow models for fluid flow in the DFN, thermal conduction models, thermal convection models, porosity parameters, permeability parameters, saturation parameters, thermal conduction property parameters, thermal convection property parameters, well location parameters, well drawdown plan parameters, and well temperature parameters. The method can also include extracting a volume of hydrocarbon from the hydrocarbon reservoir based on the volume of kerogen breaker in the fracturing fluid, and adjusting the first value based on the extracted volume.

In a second aspect, a system for hydraulic fracturing includes a hydraulic fracture model configured to determine a discrete fracture network (DFN) based on a first value representative of a volume of kerogen breaker in a fracturing fluid, a geomechanical model based on the DFN and a reservoir model based on the DFN, the geomechanical model and the reservoir model configured to determine a hydrocarbon production volume, and an adjustment module configured to adjust the first value based on the hydrocarbon production volume.

Various implementations can include some, all, or none of the following features. The system can also include a valve configured to adjust a volume of kerogen breaker in the fracturing fluid to a hydrocarbon reservoir based on the adjusted first value. The hydraulic fracture model can be configured to determine the discrete fracture network (DFN) further based on a second value representative of an amount of heat to apply to the hydrocarbon reservoir, and the adjustment module can be further configured to adjust the second value based on the hydrocarbon production volume. The amount of heat can have a heating cost, the hydrocarbon production volume can have a market value, and the adjustment model can be further configured to adjust the second value based on determining a difference between the market value and the heating cost and adjusting the second value to increase the difference. The system can also include a valve configured to adjust delivery of heat provided to a hydrocarbon reservoir based on the adjusted second value. The volume of kerogen breaker in the fracturing fluid can have a material cost, the hydrocarbon production volume can have a market value, and the adjustment model can be further configured to adjust the second value based on determining a difference between the market value and the material cost and adjusting the first value to increase the difference. The DFN can be descriptive of one or more of new fractures that are predicted to be created based on the hydraulic fracturing model, modified shale properties predicted to be modified based on the hydraulic fracturing model, and reactivated fractures that are predicted to be reactivated based on the hydraulic fracturing model and the modified shale properties. The hydraulic fracture model can be configured to determine the DFN further based on one or more of in-situ stresses in the reservoir field, pore pressures in the reservoir field, injection plans of a fracturing job, heterogeneity in the reservoir formation, elastic stiffness properties of reservoir rocks, plastic strength properties of reservoir rocks, and mechanical properties of heterogeneities, and the DFN can include a number of fractures each characterized by one or more of fracture length, fracture width, fracture height, and fracture orientation. The geomechanical model can be configured to predict the evolution of at least one of stress fields, deformation, and damage in the reservoir based on one or more of in-situ stresses in the reservoir field, pore pressures in the reservoir field, rock masses of reservoir layers, the DFN, constitutive models of rock mass that describe stress-deformation-failure processes of reservoirs under loading modes, mechanical properties of rock masses, mechanical properties of fractures, fluid mechanical interaction parameters, and thermal mechanical coupling parameters. The reservoir model can be configured to predict the evolution of multiphase flow and pressure fields in the reservoir based on one or more of reservoir pressure distribution parameters, reservoir temperature distribution parameters, multiphase flow models for fluid flow in rock, multiphase flow models for fluid flow in the DFN, thermal conduction models, thermal convection models, porosity parameters, permeability parameters, saturation parameters, thermal conduction property parameters, thermal convection property parameters, well location parameters, well drawdown plan parameters, and well temperature parameters.

The systems and techniques described here may provide one or more of the following advantages. First, a system can identify amounts of kerogen-reducing or removing agents that have corresponding estimates for volumes of extracted hydrocarbons. Second, the system can increase the efficiency of extracting volumes of hydrocarbons based on predetermined amounts of kerogen-reducing agents to be used. Third, the system can increase the profitability of hydrocarbon extraction processes in kerogen-rich formations where kerogen-reducing agents are in use.

The details of one or more implementations are set forth in the accompanying drawings and the description below. Other features and advantages will be apparent from the description and drawings, and from the claims.

DETAILED DESCRIPTION

Figure 1:
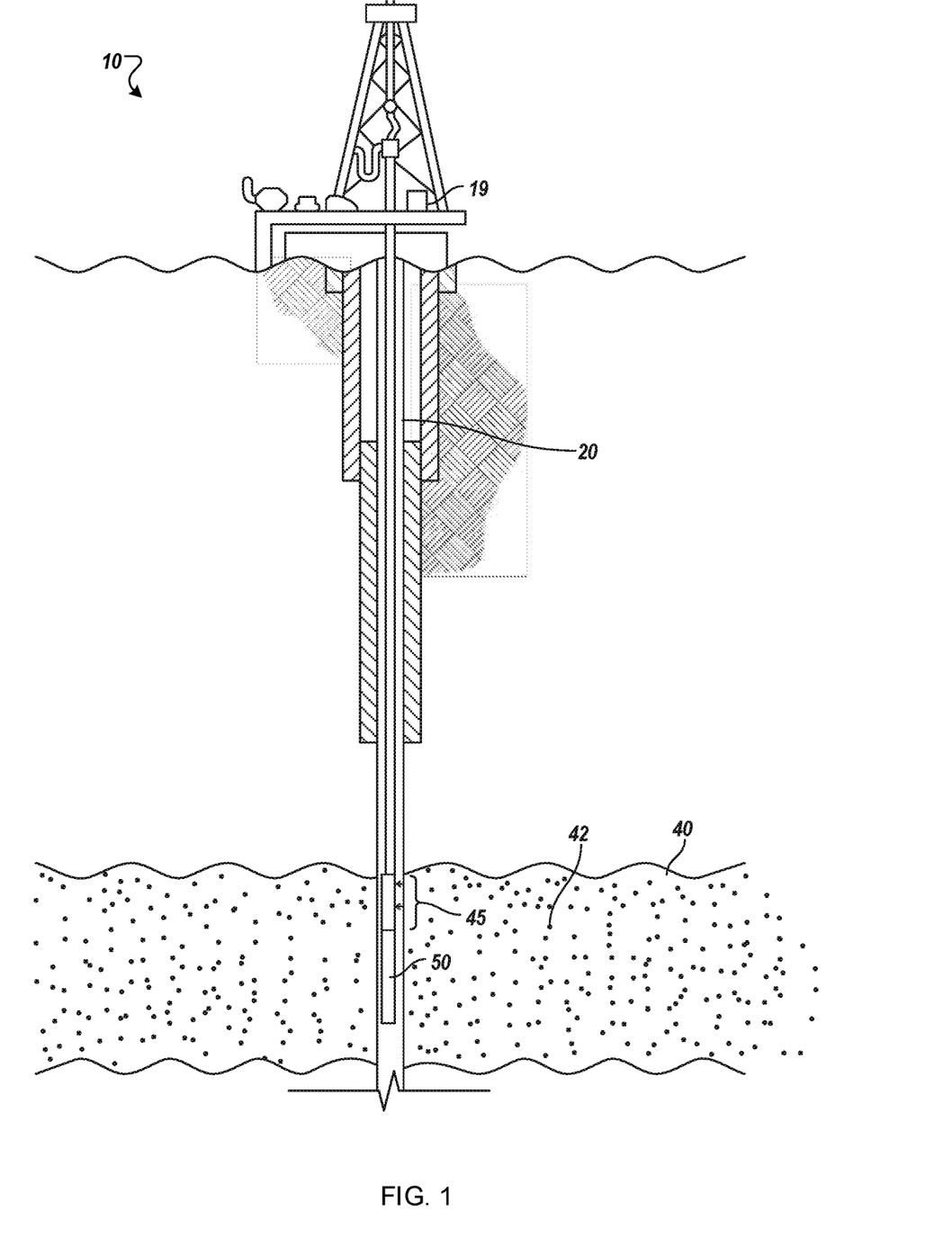
FIG. 1 is a schematic diagram of an example of a well system.

FIG. 1 is a schematic diagram of an example well system 10. The well system 10 includes a fracturing device 45, through which kerogen breaker in fracturing fluids or heat or both may be applied on a hydrocarbon production field such as a rock formation 42 of a kerogen-rich, unconventional subterranean zone 40.

In some instances, in the kerogen-rich shales, the extensive existence of kerogen may have significant influence upon the overall mechanical behavior of the shales. However, due to the micro- or nano-scale of some kerogen volumes, it is impractical to measure the mechanical properties and behaviors of kerogen in conventional geomechanics testing configurations, such as a uniaxial test, a triaxial test, or a Brazilian disc test.

Generally speaking, kerogens can demonstrate strain-softening, ductile mechanical behavior when subjected to tensile load. An implication of this observation is that kerogen can have a negative impact on the initiation and propagation of fractures and sustainability of fracture opening in kerogen-rich unconventional reservoir formations. In some implementations, these negative impacts can be reduced by adding breaker, heat, or other treatments in the fracturing fluids. The dose of breaker, for example, can determined by the tradeoff between the cost of adding breakers into fracturing fluids and the value of the resulting increase in hydrocarbon (for example, petrochemical, oil) production. In some implementations, the amount of treatment can be determined by a recursive numerical simulation, which takes stress, pressure and mechanical properties of reservoir formation, including kerogen domains, and fracturing fluid properties as inputs and can predict the fracture extension, sustainability, and productivity of the stimulated reservoir. In some implementations, the amount of treatment can be determined in real time by feedback control process, which takes target and actual hydrocarbon extraction rates as inputs and can adjust the amount of treatment to approach the target extraction rate. In some implementations, the feedback control process can take a market value for hydrocarbons and the costs of treatments as inputs, and can adjust the amount of treatment to adjust a net financial gain.

The fracturing compounds, in some implementations, may decompose or remove at least part of the kerogen domains in the rock formation 42. For example, exposure of the rock formation 42 to breaker compounds or heat or both can at least partly dissolve kerogen, easing the flow of hydrocarbons through the rock formation 42 to a wellbore 20.

As shown, the well system 10 accesses a subterranean zone 40 (which can be a formation, a portion of a formation or multiple formations), and provides access to hydrocarbons located in such subterranean zone 40. In an example implementation of system 10, the system 10 can be used for a drilling operation in which a downhole tool 50 can include or be coupled with a drilling bit. In another example implementation of system 10, the system 10 can be used for a completion, for example, hydraulic fracturing, operation in which the downhole tool 50 can include or be coupled with a hydraulic fracturing tool. Thus, the well system 10 can allow for a drilling or fracturing or stimulation operations.

The well system 10 also includes a control system 19, for example, microprocessor-based, electro-mechanical, or otherwise, that can determine or control the amount of breaker compound(s), heat, or both to be applied downhole to fracture the kerogens in the rock formation 42.

In hydraulic fracturing implementations, the bottom hole pressures used to initiate fractures around the wellbore 20 are called breakdown pressure ($P_b$). For impermeable rock $P_b$ can be related to in-situ stress and reservoir rock tensile strength, and can be expressed as:

$$P_b = 3\sigma_{min} - \sigma_{max} + \sigma^T$$

where $\sigma_{max}$ and $\sigma_{min}$ are maximum and minimum in-situ effective principal stress, respectively; $\sigma^T$ is the tensile strength of rock; $P_b$ is the pressure above the initial in-situ pore pressure that is required to break down the formation.

In some kerogen rich shales (KRS), the kerogen fibers can be fine but can exist across large volumes. Their presence can be described by widespread distributed "spider webs". The densely distributed kerogens can have various implications upon hydraulic fracturing. For example, kerogen can add extra strength to the reservoir rock, so KRS can have higher tensile strength than kerogen free shale (KFS), which can result in a higher breakdown pressure being needed to initiate the fracture in KRS. In another example, kerogen can have relatively high tensile strength at high tensile deformation, which can raise fracture propagation pressure to a higher pressure level than fracturing KFS in which the tensile strength usually drops to zero quickly after the initial fracture. In yet another example, after the proppants are placed in the fractures and the bottom hole pressured decreased, the kerogen can bounce back thereby imposing additional confining compressive stress to the proppants in addition to the in-situ stress of reservoir formation, which can cause additional embedment of proppants into the formation resulting in extra reduction of the fracture aperture.

Kerogen has negative impact on initiation and propagation of fractures, and the sustainability of fracture opening in kerogen-rich unconventional reservoir formations; fracturing fluid shall reverse the negative effect of elastic rebound of kerogen after the initial fracturing opening, including (1) use breaker to decompose, at least partially, or (2) use other materials or methods, to remove at least part of kerogen domains.

In the oilfield, commonly used oxidizers can include persulfate, bromate, $H_2O_2$, $H_2O_2$-urea, and $H_2O_2$-carbonate complexes. Cl-contained oxidizers can be used as well. In some implementations, persulfate or bromate or both can be good enough to remove all or part of kerogen. In some implementations, iron (Fe) in kerogen can act as a catalyst to speed up reactions. In some implementations, the $FeS_2$ in pyrite can be oxidized to release Fe ions.

Two series of tests, each consisting of four tests, were conducted to break kerogen under laboratory conditions. In the first series of tests, the same amount of breaker compound was used to break the same amount of kerogen, but the breaking time was different in each test. In the second series tests, different amounts of breaker compound was used to break the same amount of kerogen with same breaking times.

In the first series of tests, about 50 mg of kerogen and 500 mg of sodium bromate were added to 20 ml of deionized water in each sample, and placed in a 300 F bath for 8, 16, 32, and 64 hours, respectively. The residue was filtered out, dried, and weighed. The tests show that this type of treatment can be useful to at least partly remove kerogen.

The testing conditions and results are provided in Table 1.

TABLE 1

Weight reduction of kerogen with same amount of sodium bromate (500 mg) but different time.

| Hours at 300 F. (hours) | Kerogen initial weight (mg) | Residue weight (mg) | Weight reduction (%) |
|---|---|---|---|
| 8 | 48.0 | 22 | 54 |
| 16 | 49.1 | 11 | 78 |
| 32 | 48.8 | 7 | 86 |
| 64 | 49.7 | 7 | 86 |

In the second series of test, around 50 mg of kerogen and 50, 100, 200, or 400 mg, respectively, of sodium bromate were added to 20 ml of deionized water in each sample, and placed in a 300 F bath for 48 hours. The residue was filtered out, dried, and weighed. The testing conditions and results are presented in Table 2.

TABLE 2

Weight reduction of kerogen with different amount of sodium bromate but same time (48 hours).

| NaBrO3 weight (mg) | Kerogen initial weight (mg) | Residue weight (mg) | Weight reduction (%) |
|---|---|---|---|
| 50.0 | 50.3 | 35 | 30 |
| 99.8 | 50.5 | 29 | 43 |
| 200.1 | 50.8 | 18 | 65 |
| 400.8 | 50.9 | 7 | 86 |

In the first series of tests, ~500 mg of $NaBrO_3$ caused a kerogen weight reduction of about 86% after sufficient time. So it appears that about 400-500 mg of $NaBrO_3$ can be used to break about 50 mg of kerogen. In some implementations, it may not be necessary to break down 100% of the organic materials in kerogen. For example, as long as kerogen is weakened to such an extent that it will not significantly affect fracture initiation and propagation, the treatment can be considered to be sufficient.

Figure 2:
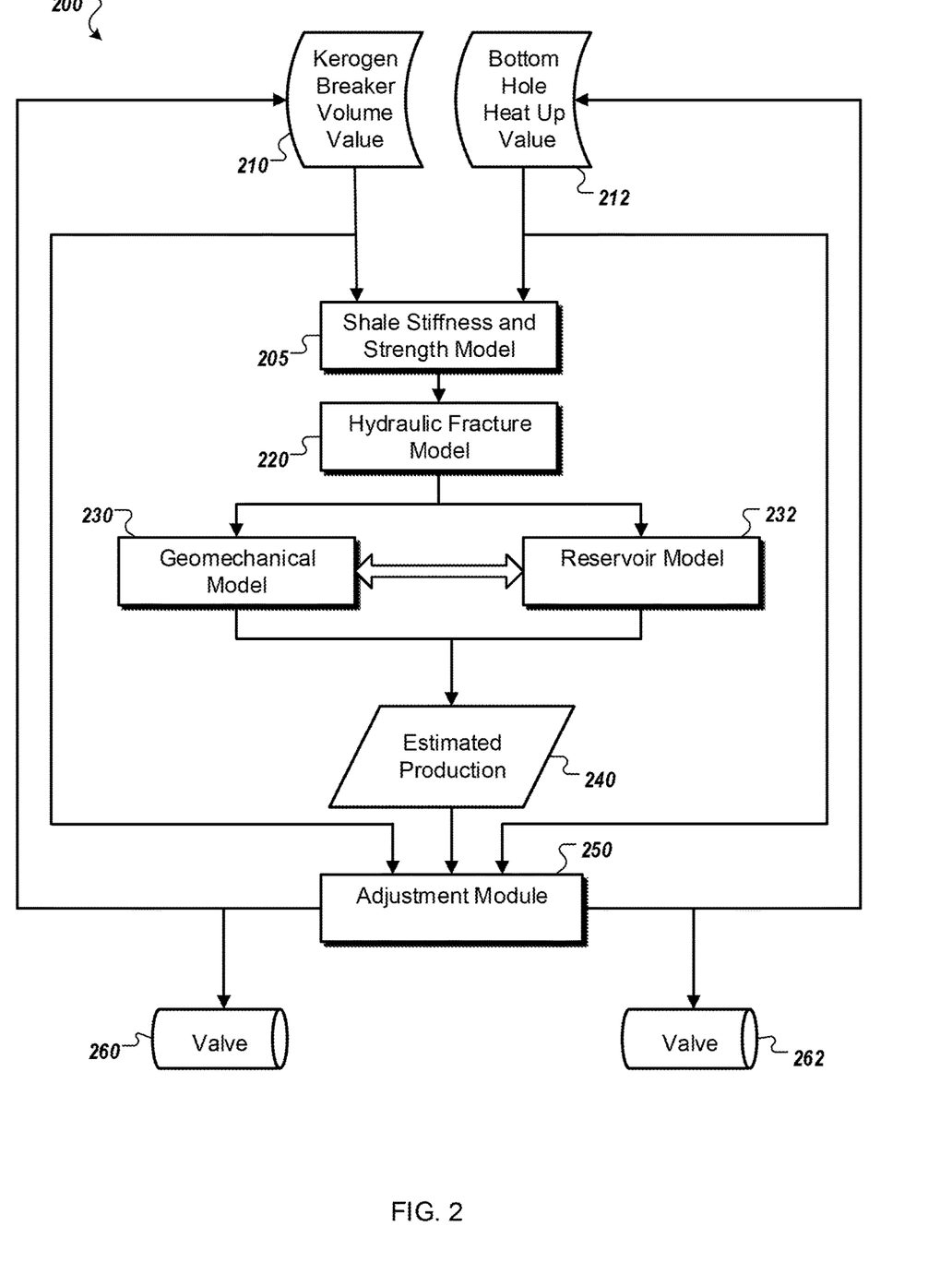
FIG. 2 is a schematic diagram that shows an example of a control system.

FIG. 2 is a schematic diagram that shows an example of a control system 200. In some embodiments, the control system 200 can be implemented by the example control system 19 of FIG. 1. As discussed above, kerogen can be at least partly dissolved by chemical means, depending on the amount of breaker (for example, sodium bromate) and treatment time used. However, undertaking such a pre-treatment operation, the time required to perform the operation, and the volume of the breaker material used to perform the operation can add extra cost to the process of extracting hydrocarbons when compared with hydraulic fracturing processes without such pre-treatment. On the other hand, in some implementations, removal or reduction of kerogen domains along the fractures can generate longer and wider fractures in hydraulic fracturing, which can enhance well productivity. In some kerogen treatment designs, the parameters of the pre-treatment operation can be adjusted to increase the net financial gain from the kerogen breaking treatment, based on the difference between the expense of the operation (for example, cost of an amount of breaker compound used) and the value of any additional hydrocarbon that can be extracted as a result. The control system 200 is configured to determine such pre-treatment parameters, apply them to the rock zone 40 of FIG. 1, and estimate the effect upon the extraction of hydrocarbons out of the wellbore 20.

The control system 200 implements a shale stiffness and strength model 205. In some implementations, the model 205 can be implemented as computer instructions stored on a computer-readable medium and executable by one or more processors. Alternatively or in addition, the model 205 can be implemented in hardware or firmware or a combination of hardware, firmware and software. The model 205 is configured to receive a kerogen breaker volume value 210 and determine a collection of modified shale formation properties. In some implementations, the kerogen breaker volume value 210 can be received from an external source, for example a predetermined startup value provided by a storage system, a startup value provided by a pseudorandom number generator, a value provided by human operator, or any other appropriate source. The kerogen breaker volume value 210 represents a quantity of a selected breaker compound that is to be delivered down hole (for example, to the rock formation 42). The shale stiffness and strength model 205 is configured to determine an amount by which a selected kerogen-rich environment such as the rock formation 42 can be affected by the application of a selected volume of kerogen breaker. For example, shale stiffness and strength in the rock formation 42 can be reduced by X % for a Y volume of kerogen breaker. In some implementations, the collection of modified shale formation properties can represent the estimated stiffness and strength of shale in the selected kerogen-rich environment as a result of providing the volume of kerogen breaker represented by the kerogen breaker volume value 210.

The shale stiffness and strength model 205 is also configured to receive a bottom hole heat up value 212 to determine the collection of modified shale formation properties. In some implementations, the bottom hole heat up value 212 can be received from an external source, for example a predetermined startup value provided by a storage system, a startup value provided by a pseudorandom number generator, a value provided by human operator, or any other appropriate source. The bottom hole heat up value 212 represents an amount of heat energy that is to be delivered down hole (for example, to the rock formation 42). For example, a temperature rise of 50° C. can be selected to at least partly dissipate kerogens. In some implementations, the heat energy can be provided chemically. For example, an acid and a base can both be delivered down hole, and the resulting reaction can create heat that can dissipate kerogen. In some implementations, the heat energy can be provided electrically. For example, microwave or radio frequency energy can be delivered downhole to heat the rock formation 42. In some implementations, other heating techniques can be used (for example, steam, radiation, vibration, ultrasound, lasers). The shale stiffness and strength model 205 is configured determine an amount by which a selected kerogen-rich environment such as the rock formation 42 can be affected by the application of a selected amount of heat delivered down hole. For example, shale stiffness and strength in the rock formation 42 can be reduced by M % for an N amount of heat energy or temperature rise. In some implementations, the collection of modified shale formation properties can represent the estimated stiffness and strength of shale in the selected kerogen-rich environment as a result of providing the amount of bottom hole heat up represented by the bottom hole heat up value 212. Without adding breaker, due to the hindrance of rubbery kerogen domains, the breakdown pressure observed during hydraulic fracturing can be larger. However, in examples in which breaker is added, kerogen domains can be at least partially broken and the hindrance can be weakened, resulting in smaller breakdown pressure values.

The collection of modified shale formation properties determined by the shale stiffness and strength model 205 are received by a hydraulic fracture model 220. In some implementations, the model 220 can be implemented as computer instructions stored on a computer-readable medium and executable by one or more processors. Alternatively or in addition, the model 220 can be implemented in hardware or firmware or a combination of hardware, firmware and software. In some implementations, the hydraulic fracture model 220 can also be configured to receive additional information about a well system such as the well system 10. For example, the hydraulic fracture model 220 can accept information including in-situ stresses and pore pressure in the reservoir field, injection plans for a fracturing job, heterogeneity in the reservoir formation, elastic stiffness properties of reservoir rocks, plastic strength properties of reservoir rocks, and mechanical properties of heterogeneities. In some implementations, some of these properties can be measured in a rock mechanics lab and provided for use by the hydraulic fracture model 220.

The hydraulic fracture model 220 simulates a main hydraulic fracturing stimulation based on the collection of modified shale formation properties. In the simulation performed by the hydraulic fracture model 220, some existing natural fractures can be reactivated, new fractures can be created, and proppants can be placed in the created fractures. As a result of this simulation, a stimulated reservoir volume (SRV) consisting of new fractures or reactivated natural fractures (or both) will be determined. The output of hydraulic fracture model 220 is a discrete fracture network (DFN) consisting of a description of a number of fractures, wherein each fracture can be characterized by length, width, height, and orientation.

The system 200 includes a geomechanical model 230. In some implementations, the model 230 can be implemented as computer instructions stored on a computer-readable medium and executable by one or more processors. Alternatively or in addition, the model 230 can be implemented in hardware or firmware or a combination of hardware, firmware and software.

The geomechanical model 230 is configured to receive the DFN and estimate an amount of hydrocarbon production that the rock formation 42 can provide based on the DFN. In some implementations, the geomechanical model 230 can be configured to receive additional information about a well system such as the well system 10. For example, the geomechanical model 230 can accept information including in-situ stresses and pore pressure in the reservoir field, rock mass of reservoir layers, constitutive models of rock mass that describe the stress-deformation-failure process of reservoir under various loading modes, mechanical properties of rock mass, mechanical properties of fractures, fluid mechanical interaction parameters, and thermal mechanical coupling parameters. In some implementations, some of these properties can be measured in a rock mechanics lab and provided for use by the geomechanical model 230.

The system 200 includes a reservoir model 232. In some implementations, the model 232 can be implemented as computer instructions stored on a computer-readable medium and executable by one or more processors. Alternatively or in addition, the model 232 can be implemented in hardware or firmware or a combination of hardware, firmware and software.

The reservoir model 232 is configured to receive the DFN and estimate an amount of hydrocarbon production that the rock formation 42 can provide based on the DFN. In some implementations, the reservoir model 232 can be configured to receive additional information about a well system such as the well system 10. For example, the reservoir model 232 can accept information including initial reservoir pressure distribution information, reservoir temperature distribution information, multiphase flow models for fluid flow in rock, multiphase flow models for fluid flow in the DFN, thermal conduction models, and convection models, rock porosity, rock permeability, saturation levels, thermal conduction properties of rock, convective properties of rock, well location, drawdown plans, and temperature at the production well.

The geomechanical model 230 and the reservoir model 232 are bidirectionally coupled to each other. For example, the reservoir model 232 can be at least partly driven by a drawdown plan at the well system 10. In examples such as this, after thermal and fluid flow modeling is performed, updated pore pressure and temperature parameters can be transferred from the reservoir model 232 to the geomechanics model 230. In such examples the geomechanical modeling can be performed to bring the system to equilibrium, then the estimated deformation, mechanical damage, and failure in the rock formation 42 can be used to estimate updated porosity and permeability parameters, and the deformation of the DFN can be used to estimate the updated aperture or other geometric parameters of the DFN. In such examples, updated geometric or mechanical properties (or both) of rock mass or the DFN (or both the rock mass and the DFN) can then be transferred from the geomechanical model 230 to the reservoir model 232, and the reservoir model 232 can perform further estimation based on these updated parameters.

The output of the reservoir model 232 and the geomechanical model 230 is an estimated production value 240. As an example, the following ideal "Darcy", steady state, radial flow equation can be used to calculate the inflow performance of a fully penetrating, damaged, vertical, open hole well in a homogeneous formation.

$$q_w = \frac{0.00708\,kh(p_r - p_w)}{B\mu\left[\ln\left(\frac{r_e}{r_w}\right) + S\right]}$$

where $q_w$ is the well flow rate; k is permeability (mD); h is the thickness of reservoir layer (ft); $p_r$ is the reservoir pressure (psi); $p_w$ is the flowing bottom hole pressure (psi); B is the formation volume factor; $\mu$ is the viscosity of reservoir fluid (cp); $r_e$ is drainage radius (ft); $r_w$ is the well radius (ft); S is the skin factor.

Shales are anitropic and heterogeneous, and the fluid flow related parameters of shale, such as permeability, skin factor, fluid viscosity, and any other appropriate parameter of shale fluid flow, can all evolve dynamically with the stress state of the rock matrix and fractures. For these types of complex systems, no analytical solutions exist to predict the production rate. Instead, a coupling of geomechanical models and reservoir models can be implemented to make reliable predictions, in which the geomechanical model is used to update the stress and pore pressure based on the updated pore pressure in the reservoir model, while the updated stress and pore pressure are used to update the permeability and porosity of rock matrix (and aperture and pressure distribution along fractures) in reservoir models to be used in the next step of computation in reservoir model.

The estimated production value 240 represents an accumulated production of hydrocarbon. An adjustment module 250 can then determine an updated kerogen breaker volume value to be provided to the shale stiffness and strength model 205 based on the kerogen breaker volume value 210 and the estimated production value 240. The adjustment module 250 can also determine an updated bottom hole heat up value to be provided to the shale stiffness and strength model 205 based on the bottom hole heat up value 212 and the estimated production value 240.

In some implementations, the system 200 can be run multiple times to approach a selected objective. For example, the adjustment model can be configured to perform a sweep or search of various kerogen breaker volume values 210 or bottom hole heat up values 212 or both to determine a range of resulting estimated production values 240.

In some implementations, the resulting estimated production values 240 can be analyzed to identify an estimated production value 240 that approaches a target parameter. For example, the estimated production value 240 having the highest estimated value can be selected, and the kerogen breaker volume value 210 or bottom hole heat up value 212 (or both) that corresponds to the selected estimated production value 240 can be identified and used to configure production in the well system 10.

The updated kerogen breaker volume value is also provided as an input to a valve 260. The valve 260 is configured to receive kerogen breaker volume values and control a flow of kerogen breaker compound that is delivered to the rock formation 42. For example, if the system 200 determines that 2000 L of a selected breaker is to be delivered down hole, then the valve 260 can be operated to provide 2000 L of the breaker to the rock formation 42.

In a similar manner, the updated bottom hole heat up value is also provided as an input to a valve 262. The valve 262 is configured to bottom hole heat up values and control an amount of heat that is delivered to the rock formation 42. For example, if the system 200 determines that the rock formation 42 is to be raised 40° F., then the valve 262 can be operated to provide one or more volumes of heat-generating chemical reactants, steam, or other agents corresponding to the identified heat rise to the rock formation 42. In some embodiments, the valve 262 can be replaced by an electrical or other control mechanism. For example, an electrical switch or amplifier can be used to determine a corresponding amount of electrical, RF, microwave, or other energy to be provided to the rock formation 42. In another example, a mechanical oscillator or other vibratory mechanism (for example, ultrasound or extremely low frequency—ELF—sound) can be used to create heat energy down hole.

In some implementations, the breaker compound can have an associated material cost (for example, a per-volume unit cost), and a kerogen breaker compound cost can be determined based on the material cost and the kerogen breaker volume value 210. For example, if a selected breaker compound cost $0.10 per liter and the kerogen breaker volume value represented 1000 liters, then the kerogen breaker compound cost would be $100.

In some examples where the bottom hole heat up is provided chemically, the chemical reactants used can have an associated per-unit heating cost (for example, a per unit volumetric cost of the reactants), and a heating cost can be determined based on the per-unit heating cost and the bottom hole heat up value 212. For example, it may be known that 1000 liters of a selected acid and 500 liters of a selected base cost $0.25/liter each, and therefore a 20° C. rise may consume (1000+500)*20=30000 liters of reactants and have a heating cost of 30000*$0.25=$7500.

In some examples where the bottom hole heat up is provided electrically, the electrical power can have an associated per-unit heating cost (for example, a per kilowatt cost for electricity), and the heating cost can be determined based on the per-unit heating cost on the bottom hole heat up value 212. In some implementations, other heating techniques can be used (for example, steam, radiation, vibration, ultrasound, extreme low frequency—ELF, lasers), and each heating technique can have its own per-unit heating cost that can be used along with the bottom hole heat up value 212 to determine the heating cost.

In some implementations, the system 200 can be configured to identify values for the kerogen breaker volume value 210 or the bottom hole heat up value 212 or both based on the per-unit costs of the kerogen breaker compound, heating costs, and the per-unit value of the estimated production 240. For example, the adjustment module 250 can be configured to identify an estimated production value 240 that approaches a maximized difference (for example, profit margin) between the value of the estimated production value 240 and the costs of heating and the volumes of kerogen breaker compound described by the kerogen breaker volume value 210 or the bottom hole heat up value 212 or both corresponding to the identified estimated production value 240.

Figure 3:
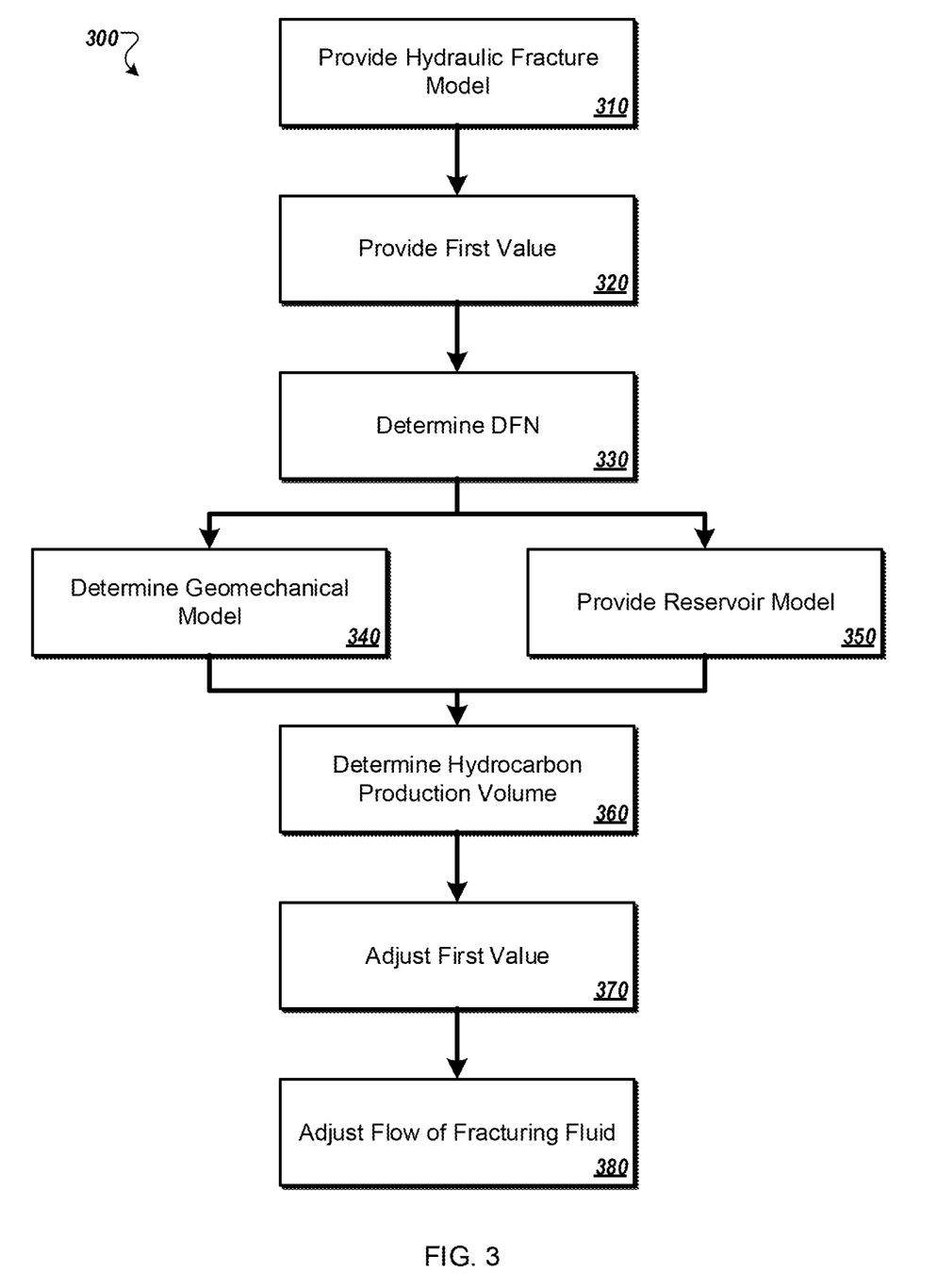
FIG. 3 is flow chart that shows an example of a process for adjusting kerogen breaker volume values.

FIG. 3 is flow chart that shows an example of a process 300 for adjusting kerogen breaker volume values. In some implementations, the process 300 can be performed at least in part by the example system 19 of the example well system 10 of FIG. 1 or by the example system 200 of FIG. 2.

In the process 300, a hydraulic fracture model is provided 310. In some implementations, the hydraulic fracture model can be the example hydraulic fracture model 220. In some implementations, the hydraulic fracture model can be configured to determine the discrete fracture network (DFN) further based on a second value representative of an amount of heat to apply to a hydrocarbon reservoir, such as the rock formation 42. In some implementations, the hydraulic fracture model can be configured to determine the DFN further based on one or more of in-situ stresses in the reservoir field, pore pressures in the reservoir field, injection plans of a fracturing job, heterogeneity in the reservoir formation, elastic stiffness properties of reservoir rocks, plastic strength properties of reservoir rocks, and mechanical properties of heterogeneities.

At 320 a first value is provided. The first value is representative of a volume of kerogen breaker in fracturing fluid. In some implementations, the first value can be the example kerogen breaker volume value 210.

At 330 a discrete fracture network (DFN) is determined. The example, the DFN is based on the hydraulic fracture model and the first value. For example, the example hydraulic fracture model 220 simulates a main hydraulic fracturing stimulation based on the collection of modified shale formation properties, and the output of the hydraulic fracture model 220 is a DFN consisting of a description of a number of fractures, wherein each fracture can be characterized by one or more of length, width, height, and orientation. In some implementations, the DFN can be descriptive of one or more of new fractures that are predicted to be created based on the hydraulic fracturing model, modified shale properties predicted to be modified based on the hydraulic fracturing model, and reactivated fractures that are predicted to be reactivated based on the hydraulic fracturing model and the modified shale properties.

At 340 a geomechanical model is determined. The geomechanical model is determined based on the DFN. For example, the geomechanical model can be the example geomechanical model 230. The geomechanical model is configured to receive the DFN and estimate an amount of hydrocarbon production that the rock formation 42 can provide based on the DFN. In some implementations, the geomechanical model can be configured to predict the evolution of at least one of stress fields, deformation, and damage in the reservoir based on one or more of in-situ stresses in the reservoir field, pore pressures in the reservoir field, rock masses of reservoir layers, the DFN, constitutive models of rock mass that describe stress-deformation-failure processes of reservoirs under loading modes, mechanical properties of rock masses, mechanical properties of fractures, fluid mechanical interaction parameters, and thermal mechanical coupling parameters.

At 350 a reservoir model is determined. The reservoir model is based on the DFN. For example, the reservoir model can be the example reservoir model 232. The reservoir model is configured to receive the DFN and estimate an amount of hydrocarbon production that the rock formation 42 can provide based on the DFN.

At 360, a hydrocarbon production volume is determined. The hydrocarbon production volume is an estimate based on the amounts of hydrocarbon production estimated by the geomechanical model and the reservoir model for the given first value. In some implementations, the hydrocarbon production volume can be the example estimated production value 240. In some implementations, the reservoir model can be configured to predict the evolution of multiphase flow and pressure fields in the reservoir based on one or more of reservoir pressure distribution parameters, reservoir temperature distribution parameters, multiphase flow models for fluid flow in rock, multiphase flow models for fluid flow in the DFN, thermal conduction models, thermal convection models, porosity parameters, permeability parameters, saturation parameters, thermal conduction property parameters, thermal convection property parameters, well location parameters, well drawdown plan parameters, and well temperature parameters.

At 370, the first value is adjusted based on the determined hydrocarbon production volume. In some implementations the first value can be adjusted by the example adjustment module 250. For example, the first value can be raised or lowered to effect an increase or decrease in the estimated production value 240.

In some implementations, the first value can have an associated monetary cost (for example, the cost of kerogen breaker compound) and the estimated hydrocarbon production value (for example, the market price of crude oil) can have an associated monetary value, and the first value can be adjusted to increase the difference between the costs and resulting estimated value (for example, increase net profit).

At 380, a flow of kerogen breaker in fracturing fluid to a hydrocarbon reservoir is adjusted based on the adjusted first value. For example, the example adjusted kerogen breaker volume value 210 can be used as part of a control routine that directs the operation of the example valve 260. In some implementations, the flow of kerogen breaker in fracturing fluid to the rock formation 42 can be based on an adjusted first value that increases the difference between the value of hydrocarbon expected to be extracted by the well system 10 and cost of the amount of kerogen breaker compound used as part of the extraction process.

In some implementations, the first value can be adjusted at 370 based on an actual hydrocarbon production volume. For example, as the valve 260 is operated to control the volume of kerogen breaker compound that is delivered to the rock formation 42, the amount of hydrocarbons extracted from the rock formation 42 may not be the exact amount predicted by the geomechanical model 230 and the reservoir model 232. In such examples, the actual value of the produced hydrocarbons can be greater or less than the value of the estimated production volume, and the first value can be adjusted to increase the difference between the costs and resulting actual value (for example, increase net profit).

In some implementations, a second value representative of an amount of heat to apply to the hydrocarbon reservoir can be provided, the DFN can be determined based on the second value, the second value can be adjusted based on the hydrocarbon production volume, and the amount of heat to apply to the hydrocarbon reservoir can be adjusted based on the adjusted second value. For example, the example bottom hole heat up value 212 can represent an amount of heat energy or heat-producing material that can be used to dissipate an amount of kerogen and affect the amount of hydrocarbon produced by the example well system 10.

In some implementations, the volume of kerogen breaker in fracturing fluid can have a material cost, the hydrocarbon production volume can have a market value, and adjusting the first value can include determining a difference between the market value and the material cost and adjusting the first value to increase the difference. In some implementations, the amount of heat can have a heating cost, the hydrocarbon production volume can have a market value, and adjusting the second value can include determining a difference between the market value and the heating cost and adjusting the second value to increase the difference.

For example, the bottom hole heat up value 212 may indicate that $10,000 worth of acid and base would need to be delivered down hole to generate a predetermined amount of kerogen-dissipating heat, and the kerogen breaker volume value 210 may indicate that $5,000 worth of breaker compound would need to be delivered down hole to chemically dissipate a predetermined about of kerogen, and the estimated production value 240 can indicate that $100,000 worth of hydrocarbons could be extracted as a result. This would result in a $-10,000-$5,000+$100,000=$85,000 net gain. The system 200 can, for example, adjust the kerogen breaker volume value 210 to indicate that $6,000 worth of breaker compound could be used to produce an estimated production value 240 having a worth of $110,000, or a $94,000 net gain. In such an example, the system 200 can select the latter kerogen breaker volume value 210 over the first because the latter value provides a greater net return on investment in breaker compounds and heat than the former value (for example, $94,000 versus $85,000, an additional $9,000 return on an additional $1,000 investment).

In some implementations, the process 300 can include extracting a volume of hydrocarbon from the hydrocarbon reservoir based on the volume of kerogen breaker in fracturing fluid, and adjusting the first value based on the extracted volume. In some implementations, the process 300 can include extracting a volume of hydrocarbon from the hydrocarbon reservoir based on the volume of kerogen breaker in fracturing fluid, and adjust the second value based on the extracted volume. For example, the well system 10 may initially be configured to deliver the $5,000 worth of breaker compound down hole, and extract $100,000 worth of hydrocarbon as a result. The control system 200 can adjust the valve 260 to increase the amount of breaker compound being delivered down hole and detect that an additional amount of hydrocarbon is being produced from the rock formation 42. In some implementations, the control system 200 can adjust the kerogen breaker volume value 210, the bottom hole heat up value 212, or both, based on the increases and decreases in the hydrocarbon volumes that can be extracted as a result, for example, to improve production volumes or profit margins for the amounts of hydrocarbon that can be extracted as a result.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. As another example, although certain implementations described herein may be applicable to tubular systems (for example, drill pipe or coiled tubing), implementations may also utilize other systems, such as wireline, slickline, e-line, wired drill pipe, wired coiled tubing, and otherwise, as appropriate. As another example, some criteria, such as temperatures, pressures, and other numerical criteria are described as within a particular range or about a particular value. In some aspects, a criterion that is about a particular value is within 5-10% of that particular value. Accordingly, other implementations are within the scope of the following claims.

What is claimed is:

1. A method for treating a geologic formation, comprising:
   receiving a hydraulic fracture model configured to simulate a main hydraulic fracturing stimulation;
   receiving a first value representative of a volume of kerogen breaker in a fracturing fluid;
   determining a discrete fracture network (DFN) comprising a description of a number of fractures, wherein each fracture can be characterized by length, width, height, and orientation that are estimated based on the hydraulic fracture model and predicted effects of the volume of kerogen breaker represented by the first value on initiation and propagation of the fractures and sustainability of the fractures during hydrocarbon extraction;
   determining a first hydrocarbon production volume value based on a geomechanical model and the DFN;
   determining a second hydrocarbon production volume value based on a reservoir model and the DFN;
   determining a third estimated hydrocarbon production volume based on the determined first hydrocarbon production volume value and the determined second hydrocarbon production volume value;
   adjusting the first value based on the determined third estimated hydrocarbon production volume value;
   adjusting the DFN based on the hydraulic fracture model and predicted effects of the volume of kerogen breaker represented by the adjusted first value on initiation and propagation of the fractures and sustainability of the fractures during hydrocarbon extraction;
   determining a fourth hydrocarbon production volume value based on the geomechanical model and the adjusted DFN;
   determining a fifth hydrocarbon production volume value based on the reservoir model and the adjusted DFN;
   determining a sixth estimated hydrocarbon production volume based on the determined third hydrocarbon production volume value and the determined fourth hydrocarbon production volume value;
   adjusting the first value based on the determined sixth estimated hydrocarbon production volume value;

adjusting a volume of kerogen breaker in the fracturing fluid based on the adjusted first value;
providing the adjusted volume of kerogen breaker in the fracturing fluid to a hydrocarbon reservoir in a subterranean zone;
modifying shale stiffness and strength properties in the hydrocarbon reservoir based on the adjusted volume of kerogen breaker; and
extracting a volume of hydrocarbon from the hydrocarbon reservoir based on the modified shale stiffness and strength properties in the hydrocarbon reservoir, wherein the sixth estimated hydrocarbon production volume is predictive of the extracted volume.

2. The method of claim 1, further comprising:
providing a second value representative of an amount of heat to apply to the hydrocarbon reservoir in the subterranean zone;
adjusting the second value based on the third hydrocarbon production volume value; wherein,
determining the DFN is further based on the second value; and
adjusting the amount of heat to apply to the hydrocarbon reservoir in the subterranean zone is further based on the second value.

3. The method of claim 2, wherein the amount of heat has a heating cost, the third estimated hydrocarbon production volume has a market value, and adjusting the second value comprises determining a difference between the market value and the heating cost and adjusting the second value to increase the difference.

4. The method of claim 2, further comprising adjusting the second value based on the extracted volume, wherein the extracted volume is based on the volume of kerogen breaker in the fracturing fluid.

5. The method of claim 1, wherein the volume of kerogen breaker in the fracturing fluid has a material cost, the estimated third hydrocarbon production volume has a market value, and adjusting the first value comprises determining a difference between the market value and the material cost and adjusting the first value to increase the difference.

6. The method of claim 1, wherein the DFN is descriptive of one or more of new fractures that are predicted to be created based on the hydraulic fracture model, modified shale properties predicted to be modified based on the hydraulic fracture model, and reactivated fractures that are predicted to be reactivated based on the hydraulic fracture model and the modified shale properties.

7. The method of claim 1, wherein the hydraulic fracture model is configured to determine the DFN further based on one or more of in-situ stresses in the hydrocarbon reservoir, pore pressures in the hydrocarbon reservoir, injection plans of a fracturing job, heterogeneity in the hydrocarbon reservoir, elastic stiffness properties of reservoir rocks, plastic strength properties of reservoir rocks, and mechanical properties of heterogeneities, and the DFN comprises a number of fractures each characterized by one or more of fracture length, fracture width, fracture height, and fracture orientation.

8. The method of claim 1, wherein the geomechanical model is configured to predict evolution of at least one of stress fields, deformation, and damage in the hydrocarbon reservoir based on one or more of in-situ stresses in the hydrocarbon reservoir, pore pressures in the hydrocarbon reservoir, rock masses of reservoir layers, the DFN, constitutive models of rock mass that describe stress-deformation-failure processes of reservoirs under loading modes, mechanical properties of rock masses, mechanical properties of fractures, fluid mechanical interaction parameters, and thermal mechanical coupling parameters.

9. The method of claim 1, wherein the reservoir model is configured to predict evolution of multiphase flow and pressure fields in the hydrocarbon reservoir based on one or more of reservoir pressure distribution parameters, reservoir temperature distribution parameters, multiphase flow models for fluid flow in rock, multiphase flow models for fluid flow in the DFN, thermal conduction models, thermal convection models, porosity parameters, permeability parameters, saturation parameters, thermal conduction property parameters, thermal convection property parameters, well location parameters, well drawdown plan parameters, and well temperature parameters.

10. The method of claim 1, further comprising adjusting the first value based on the extracted volume, wherein the extracted volume is based on the volume of kerogen breaker in the fracturing fluid.

11. A system for hydraulic fracturing comprising:
a control system comprising one or more processors; and
a non-transitory computer-readable medium storing instructions executable by the one or more processors to perform operations comprising:
receive a first value representative of a volume of kerogen breaker in a fracturing fluid;
determining a discrete fracture network (DFN) comprising a description of a number of fractures, wherein each fracture can be characterized by length, width, height, and orientation that are estimated based on a hydraulic fracture model and predicted effects of the volume of kerogen breaker represented by the first value on initiation and propagation of the fractures and sustainability of the fractures during hydrocarbon extraction;
determining a first hydrocarbon production volume value, by a geomechanical model based on the DFN;
determining a second hydrocarbon production volume value, by a reservoir model based on the DFN;
determining an third estimated hydrocarbon production volume based on the determined first hydrocarbon production volume value and the determined second hydrocarbon production volume value;
adjusting, by an adjustment module, the first value based on the determined third estimated hydrocarbon production volume;
adjusting the DFN based on the hydraulic fracture model and predicted effects of the volume of kerogen breaker represented by the adjusted first value on initiation and propagation of the fractures and sustainability of the fractures during hydrocarbon extraction;
determining a fourth hydrocarbon production volume value based on the geomechanical model and the adjusted DFN;
determining a fifth hydrocarbon production volume value based on the reservoir model and the adjusted DFN;
determining a sixth estimated hydrocarbon production volume based on the determined third hydrocarbon production volume value and the determined fourth hydrocarbon production volume value;
adjusting, by the adjustment module, the first value based on the determined sixth estimated hydrocarbon production volume value;
controlling, by the control system, a valve to adjust a volume of kerogen breaker in the fracturing fluid based on the adjusted first value; and
providing, based on the controlling, the adjusted volume of kerogen breaker in the fracturing fluid to a hydrocarbon reservoir in a subterranean zone, wherein shale stiffness and strength properties in the hydrocarbon reservoir are modified based on the adjusted volume of kerogen breaker such that the sixth estimated hydrocarbon production volume is predictive of a volume of hydrocarbon extracted from the hydrocarbon reservoir based on the modified shale stiffness and strength properties in the hydrocarbon reservoir.

12. The system of claim 11, wherein:
the hydraulic fracture model is configured to determine the discrete fracture network (DFN) further based on a second value representative of an amount of heat to apply to the hydrocarbon reservoir; and
the adjustment module is further configured to adjust the second value based on the third estimated hydrocarbon production volume.

13. The system of claim 12, wherein the amount of heat has a heating cost, the third estimated hydrocarbon production volume has a market value, and the adjustment module is further configured to adjust the second value based on determining a difference between the market value and the heating cost and adjusting the second value to increase the difference.

14. The system of claim 12, further comprising a valve configured to adjust delivery of heat provided to a hydrocarbon reservoir based on the adjusted second value.

15. The system of claim 11, wherein the volume of kerogen breaker in the fracturing fluid has a material cost, the third estimated hydrocarbon production volume has a market value, and the adjustment module is further configured to adjust the second value based on determining a difference between the market value and the material cost and adjusting the first value to increase the difference.

16. The system of claim 11, wherein the DFN is descriptive of one or more of new fractures that are predicted to be created based on the hydraulic fracture model, modified shale properties predicted to be modified based on the hydraulic fracture model, and reactivated fractures that are predicted to be reactivated based on the hydraulic fracture model and the modified shale properties.

17. The system of claim 11, wherein the hydraulic fracture model is configured to determine the DFN further based on one or more of in-situ stresses in the hydrocarbon reservoir, pore pressures in the hydrocarbon reservoir, injection plans of a fracturing job, heterogeneity in the hydrocarbon reservoir, elastic stiffness properties of reservoir rocks, plastic strength properties of reservoir rocks, and mechanical properties of heterogeneities, and the DFN comprises a number of fractures each characterized by one or more of fracture length, fracture width, fracture height, and fracture orientation.

18. The system of claim 11, wherein the geomechanical model is configured to predict evolution of at least one of stress fields, deformation, and damage in the hydrocarbon reservoir based on one or more of in-situ stresses in the hydrocarbon reservoir, pore pressures in the hydrocarbon reservoir, rock masses of reservoir layers, the DFN, constitutive models of rock mass that describe stress-deformation-failure processes of reservoirs under loading modes, mechanical properties of rock masses, mechanical properties of fractures, fluid mechanical interaction parameters, and thermal mechanical coupling parameters.

19. The system of claim 11, wherein the reservoir model is configured to predict evolution of multiphase flow and pressure fields in the hydrocarbon reservoir based on one or more of reservoir pressure distribution parameters, reservoir temperature distribution parameters, multiphase flow models for fluid flow in rock, multiphase flow models for fluid flow in the DFN, thermal conduction models, thermal convection models, porosity parameters, permeability parameters, saturation parameters, thermal conduction property parameters, thermal convection property parameters, well location parameters, well drawdown plan parameters, and well temperature parameters.

* * * * *

UNITED STATES PATENT AND TRADEMARK OFFICE
CERTIFICATE OF CORRECTION

PATENT NO.       : 10,619,469 B2  
APPLICATION NO.  : 15/190687  
DATED            : April 14, 2020  
INVENTOR(S)      : Yanhui Han et al.

Page 1 of 1

It is certified that error appears in the above-identified patent and that said Letters Patent is hereby corrected as shown below:

On the Title Page

Item [57], Line 1, Before "includes" delete "that".

Signed and Sealed this  
Fourteenth Day of July, 2020

Andrei Iancu  
*Director of the United States Patent and Trademark Office*